United States Patent [19]

Go

[11] Patent Number: 5,155,466
[45] Date of Patent: Oct. 13, 1992

[54] AUTOMATIC FREQUENCY CONTROL SYSTEM

[75] Inventor: Young D. Go, Seoul, Rep. of Korea

[73] Assignee: Goldstar Co., Ltd., Seoul, Rep. of Korea

[21] Appl. No.: 718,267

[22] Filed: Jun. 20, 1991

[30] Foreign Application Priority Data

Jun. 22, 1990 [KR] Rep. of Korea ............... 9312/1990

[51] Int. Cl.[5] .................................... H04M 11/04
[52] U.S. Cl. ......................... 340/310 R; 340/310 A; 340/310 CP; 375/97; 363/165; 307/271
[58] Field of Search ........ 340/310 R, 310 A, 310 CP; 375/37, 97; 363/165; 307/525, 271; 328/140

[56] References Cited

U.S. PATENT DOCUMENTS

| | | | |
|---|---|---|---|
| 4,598,350 | 7/1986 | Sakai et al. | 363/35 |
| 4,628,443 | 12/1986 | Rickard et al. | 340/310 CP |
| 4,644,320 | 2/1987 | Carr et al. | 340/310 A |
| 4,908,600 | 3/1990 | Martinez | 340/310 R |
| 4,988,972 | 1/1991 | Takagi | 340/310 R |

Primary Examiner—Jin F. Ng
Assistant Examiner—Nina Tong

[57] ABSTRACT

An automatic frequency control system applicable to home automation system and electronic appliances requiring precise frequency, comprising a resonance transmitter, a carrier transmitter, a frequency detector, highest and lowest limit oscillators for generating highest and lowest limit frequencies, a comparator including first and second phase comparators, and a resistance varying unit. The system provides the precise frequency to the electronic appliances by detecting the frequency of the data transmitted to power lines, comparing by the comparator the transmission frequency with the highest and lowest limit frequencies and decreasing or increasing the resistance of the resistance varying unit depending upon the compared resultant.

4 Claims, 2 Drawing Sheets

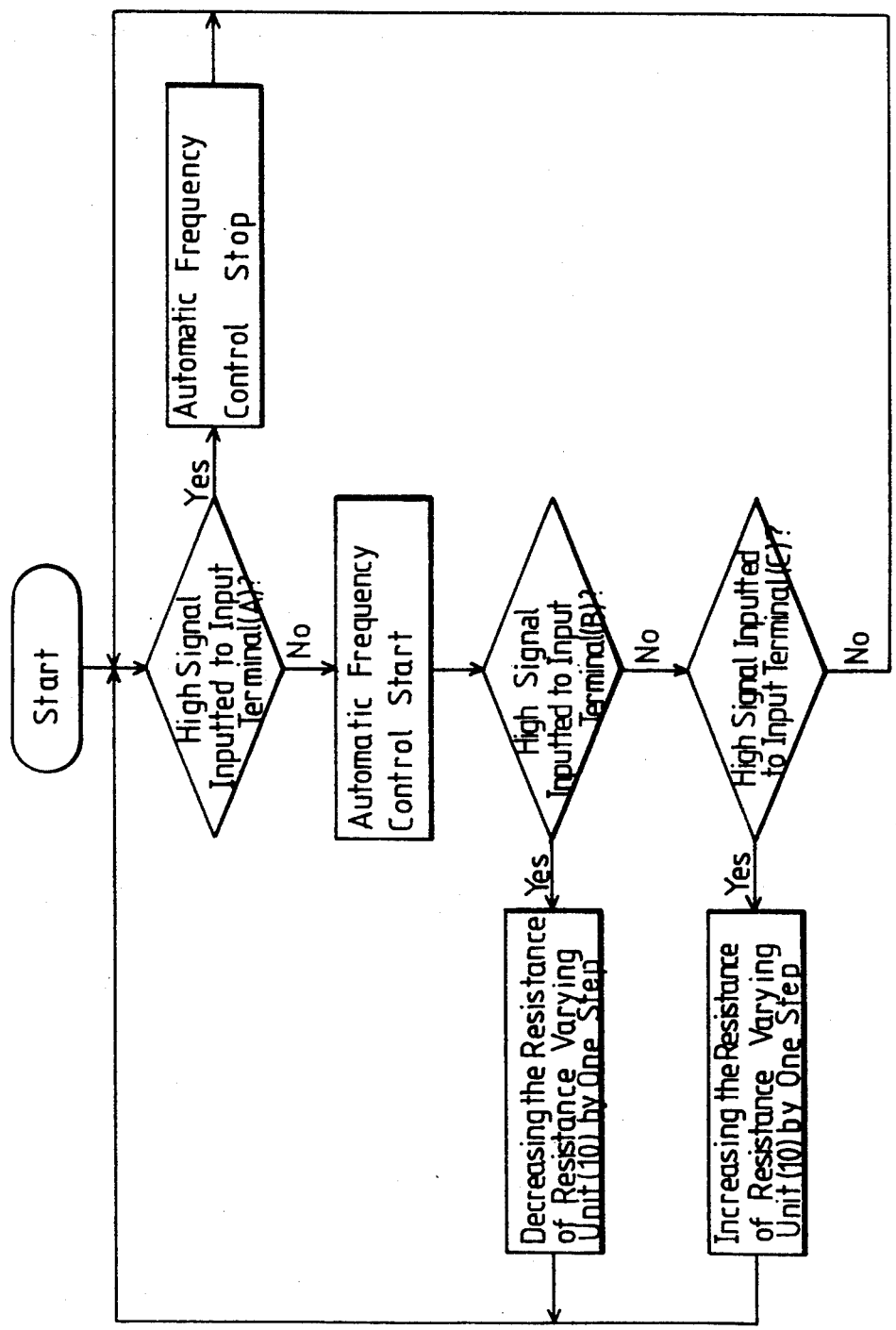

5,155,466

AUTOMATIC FREQUENCY CONTROL SYSTEM

BACKGROUND OF THE INVENTION

The present invention relates to an input frequency control system of an electronic home appliance in the home automation system which transmits data by use of the frequency shift keying method, and more particularly to an automatic frequency control system which can control automatically the data being inputted to the electronic home appliance by detecting the frequency of the data being transmitted to the power line to identify whether the frequency is within the rated frequency range.

In general, the data being transmitted to the power line, in the home automation system, are inputted to electronic home appliances after having been converted into digital signals and the frequency thereof has been set in response to the resistance, which is a fixed value, of a variable resistor. Accordingly, in case that the frequency, which is a most important factor in the data transmission, is varied on occasion, error data may be transmitted to the electronic home appliances from the power line, moreover there may be sometimes occurred an occasion that data are not transmitted due to the frequency conversion, thereby causing the electronic home appliances to operate in error.

SUMMARY OF THE INVENTION

Therefore, it is an object of the present invention to provide an automatic frequency control system which, in case that the frequency of the data being transmitted to the power line from the home automation system is changed, controls automatically the resistance of the resistor for frequency setting in proportion to the frequency change, and then inputs in precise the data to the electronic home appliances.

The above object of the present invention is accomplished by detecting the frequency of the data being transmitted to the power line, comparing the detected transmission frequency with the highest limit frequency and the lowest limit frequency which are set by a highest limit oscillation unit and a lowest limit oscillation unit, and at this time, in case that the transmission frequency is included within the range of the highest limit frequency and the lowest limit frequency, maintaing the resistance of the frequency setting resistor, in case that the transmission frequency is higher than the highest limit frequency, decreasing the resistance of the frequency setting resistor, and in case that the transmission frequency is lower than the lowest limit frequency, increasing the resistance of the frequency setting resistor.

BRIEF DESCRIPTION OF THE DRAWINGS

The above and other objects, features and advantages of the invention will be apparent from the detailed description taken in conjunction with the accompanying drawings, in which:

FIG. 2 is a control flowchart of a microcomputer of FIG. 1.

DETAILED DESCRIPTION OF THE INVENTION

Figure 1:
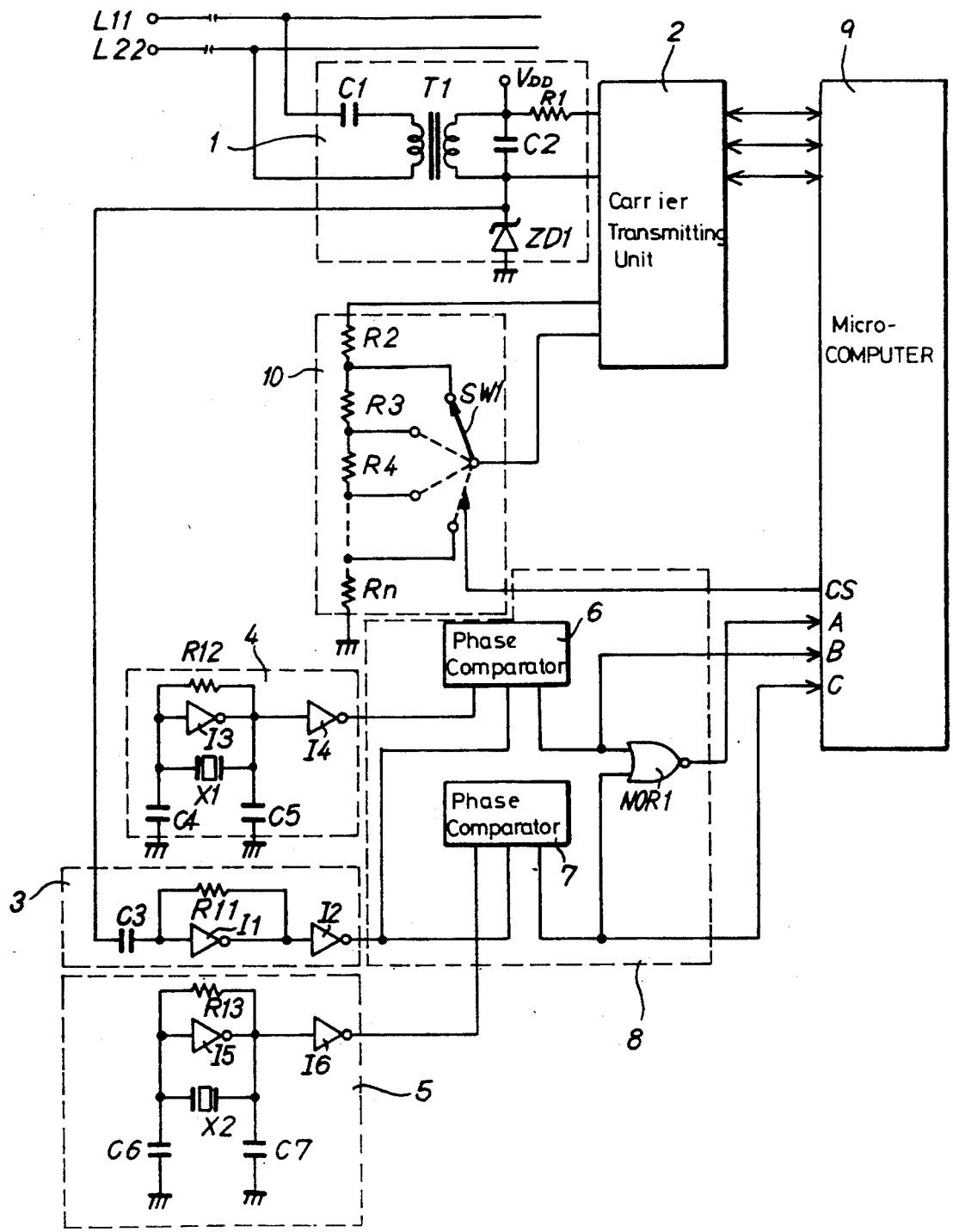
FIG. 1 is a curcuit diagram showing the configuration of the automatic frequency control system according to the present invention.

Referring to FIG. 1, the automatic frequency control system of the present invention comprises a resonance transmitting unit 1 for transmitting the center frequency (125 KHz) of the data being inputted through AC power lines $L_{11}$ and $L_{22}$ by the resonance of a transformer $T_1$ zener diode $ZD_1$, a capacitor $C_2$ and a capacitor $C_1$; a carrier transmitting unit 2 for converting the data transmitted from the resonance transmitting unit into digital signals and then outputting the converted digital signals; a frequency detecting unit 3 for shaping and outputting the frequency which is transmitted from the resonance transmitting unit 1; a highest limit oscillation unit 4 and a lowest limit oscillation unit 5 each for outputting a highest limit frequency and a lowest limit frequency, respectively; a comparing unit 8 for comparing the transmission frequency being outputted from the frequency detecting unit 3 with the highest limit frequency of the highest limit oscillation unit 4 and the lowest limit frequency of the lowest limit oscillation unit 5, respectively, and outputting the resultant signal; a microcomputer 9 for outputting a resistance setting control signal CS in response to the resultant signal of the comparing unit 8 and receiving the output data of the carrier transmitting unit 2 to control the whole system; and a resistance varying unit 10 for varying the resistance in response to the resistance setting control signal CS of the microcomputer 9 so as to be set at the transmission data frequency of the carrier transmitting unit 2. In the above configuration, the highest limit oscillation unit 4 is composed of a quartz oscillation element $X_1$, capacitors $C_4$ and $C_5$, inverters $I_3$ and $I_4$ and a resistor $R_{12}$ and generates a highest limit frequency of 127.75 KHz, and the lowest limit oscillation unit 5 is composed of a quartz oscillation element $X_2$, capacitors $C_6$ and $C_7$, inverters $I_5$ and $I_6$ and a resistor $R_{13}$ and generates a lowest limit frequency of 122.25 KHz, and the comparing unit 8 is composed of first and second phase comparators 6 and 7 for comparing the transmission frequency outputted from the frequency detecting unit 3 with the highest limit frequency of the highest limit oscillation unit 4 and the lowest frequency of the lowest limit oscillation unit 5, respectively, and a NOR gate $NOR_1$ for NORing the output signals of the phase comparators 6 and 7.

Hereinafter, the operation and effect of the present invention will be described in detail.

When the data being inputted through the AC power lines $L_{11}$ and $L_{22}$, that is, the transmission data of which the frequency is modulated by ±2.75 KHz on the basis of the center frequency of 125 KHz pass through the coupling capacitor $C_1$ of the resonance transmitting unit 1 and is applied to the carrier transmitting unit 2 after having passed through the resonance transformer $T_1$, the capacitor $C_2$ and the resistor $R_1$, the carrier transmitting unit 1 converts the transmission data being outputted from the resonance transmitting unit 1 into digital signals and transmits the digital signals to the data line of the microcomputer 9. At this time, the frequency of the transmission data being outputted from the resonance transmitting unit 1 may be changed in response to the resistances of the resistors $R_2$-$R_n$ of the resistance varying circuit 10, and when the resistances of the resistors $R_2$-$R_n$ are fixed, the transmission frequency may be changed by an external noise, a noise of the AC power lines $L_{11}$ and $L_{22}$ or a permissible error of peripheral circuits, and in case that the transmission frequency is changed, the data of the carrier transmitting unit 2 may not be transmitted to the microcomputer 9 or may be erroneously transmitted.

Accordingly, the frequency of the transmission data being outputted from the resonance transmitting unit 1 is applied respectively to the phase comparators 6 and 7 of the comparing unit 8 through the frequency detecting unit 3 so as to be compared and detected as to whether it is within the desired frequency range, and then the resistances of the resistors $R_2$-$R_n$ of the resistance varying unit 10 are increased or decreased depending upon the detected resultant, thereby controlling the transmission frequency. That is, the frequency of the transmission data being transmitted from the transformer $T_1$ of the resonance transmitting unit 1 passes through the coupling capacitor $C_3$ of the frequency detecting unit 3 and is shaped by the inverters $I_1$ and $I_2$ and then applied to the phase comparators 6 and 7 as a comparative signal. At this moment, the highest limit frequency of 127.75 KHz, which is outputted at the highest limit oscillation unit 4, is applied to the first phase comparator 6 as a reference signal and the lowest limit frequency of 122.25 KHz, which is outputted at the lowest limit oscillation unit 5, is applied to the second phase comparator 7 as a reference signal.

Accordingly, the phase comparators 6 and 7 compare the transmission frequency, which is outputted from the frequency detecting unit 3, with the highest limit frequency of the highest limit oscillation unit 4 and the lowest limit frequency of the lowest limit oscillation unit 5, respectively, and output the resultant signal thereupon.

For instance, in case that the transmission data being outputted from the frequency detecting unit 3 is higher than the highest limit frequency (127.75 KHz) of the highest limit oscillation unit 4, a high level signal is outputted from the first phase comparator 6 and applied to one side input terminal of the NOR gate $NOR_1$ and an input terminal B of the microcomputer 9, and of course, a low level signal is outputted from the second phase comparator 7 at this time.

And when the transmission data of the frequency detecting unit 3 is lower than the lowest limit frequency (122.25 KHz) of the lowest limit oscillation unit 5, a high level signal is outputted from the second phase comparator 7 and applied to the other side input terminal of the NOR gate $NOR_1$ and an input terminal C of the microcomputer 9, and of course, a low level signal is outputted from the first phase comparator 6 at this time.

In addition, in case that the transmission data of the frequency detecting unit 3 is lower than the highest limit frequency (127.75 KHz) of the highest limit oscillation unit 4 and higher than the lowest frequency (122.25 KHz) of the lowest limit oscillation unit 5 that is, when the transmission frequency is included within the frequency range of 122.25 KHz-127.75 KHz, low level signals are outputted from both the phase comparators 6 and 7 and applied to the input terminals of the NOR gate $NOR_1$ and the input terminals B and C of the microcomputer 9.

And, when a high level signal is outputted at the phase comparator 6 or 7, a low level signal is outputted from the NOR gate $NOR_1$ and applied to the input terminal A of the microcomputer 9, and when low level signals are outputted from both the phase comparators 6 and 7, a high level signal is outputted from the NOR gate $NOR_1$ and applied to the input terminal A of the microcomputer 9.

Thus, the microcomputer 9 sets the resistance of the resistance varying unit 10 as shown in FIG. 2, in accordance with the signals being applied to the input terminals A, B and C thereof.

That is, in case that a high level signal is outputted from the NOR gate $NOR_1$ and applied to the input terminal A of the microcomputer 9, the microcomputer 9 recognizes that the transmission frequency of the resonance transmitting unit 1 is included within the range of the highest limit frequency and the lowest limit frequency, thereby maintaining the resistance setting control signal CS as it is so that the resistance of the resistance varying unit 10 is maintained at the present state.

However, in case that a low level signal is outputted at the NOR gate $NOR_1$ and applied to the input terminal A of the microcomputer 9, a high level signal is applied to the input terminal B or C thereof, thereby decreasing or increasing the resistance setting control signal CS by one step so that the resistance of the resistance varying unit 10 is decreased or increased by one step.

For instance, in case that a low level signal is applied to the input terminal A and a high level signal is applied to the input terminal B of the microcomputer 9, the microcomputer 9 recognizes that the transmission frequency of the resonance transmitting unit 1 is higher than the highest limit frequency and thus, reduces the resistance setting control signal CS by one step, thereby the switch $SW_1$ of the resistance varying unit 10 is connected in a one step decreased state so that the resistance of the resistance varying unit 10 is decreased by one step.

Similarly, in case that a low level signal is applied to the input terminal A and a high level signal is applied to the input terminal C of the microcomputer 9, the microcomputer 9 recognizes that the transmission frequency of the resonance transmitting unit 1 is lower than the lowest limit frequency and thus, increases the resistance setting control signal CS by one step, thereby the switch $SW_1$ of the resistance varying unit 10 is connected in a one step increased state, so that the resistance of the resistance varying unit 10 is increased by one step.

As above, in case that the transmission frequency of the resonance transmitting unit 1 is higher than the highest limit frequency or lower than the lowest limit frequency, the resistance of the resistance varying unit 10 is decreased or increased by one step so as to be set at the transmission frequency of the carrier transmitting unit 2, thereby the transmission data of the resonance transmitting unit 1 are converted in precise into digital signals at the carrier transmitting unit 2 and then applied to the microcomputer 9.

As described above in detail, the present invention provides the effects that the reliability and preciseness of the home automation system can be enhanced and also it can be applied to various kinds of electronic appliances which require a precise frequency by carrying out the operations of comparing the transmission frequency detected at the power lines with the highest and lowest limit frequencies and decreasing or increasing the resistance of the resistance varying unit according to the compared resultant so as to be set at the transmission frequency.

What is claimed is:

1. An automatic frequency control system comprising:
    a resonance transmitting unit for transmitting a center frequency of a transmission data inputted through alternate current power lines;
    a carrier transmitting unit for converting said transmission data of said resonance transmitting unit into digital signals and transmitting the converted digital signal to a data line of a microcomputer;
    a frequency detecting unit for shaping and outputting the transmission frequency of said resonance transmitting unit;
    a highest limit oscillation unit for generating a highest limit frequency;
    lowest limit oscillation unit for generating a lowest limit frequency;
    a comparing unit for comparing the transmission frequency outputted from said frequency detecting unit with said highest and lowest limit frequencies of said highest and lowest limit oscillation units, respectively, and applying the compared resultant signal to said microcomputer; and
    a resistance varying unit for varying the resistance according to a resistance setting control signal generated from said microcomputer so as to automatically set the frequency at the transmission frequency of said carrier transmitting unit.

2. The system as claimed in claim 1, wherein said comparing unit comprises first and second phase comparators for comparing the transmission frequency outputted from said frequency detecting unit with the highest limit frequency of said highest limit oscillation unit and the lowest limit frequency of said lowest limit oscillation unit, respectively, and applying the compared resultant signal to said microcomputer as a discrimination control signal and a NOR gate for outputting another discrimination control signal to said microcomputer when inputted with the compared resultant signals from said first and second phase comparators.

3. The system as claimed in claim 2, wherein the system is constituted such that the output signal of said NOR gate from the output signal of said first and second phase comparators is applied to said microcomputer as an automatic frequency control stop signal when the transmission frequency outputted from said frequency detecting unit is within the frequency range of said highest and lowest limit oscillation units.

4. The system as claimed in claim 3, wherein the system is constituted such that said resistance of said resistance varying unit is increased or decreased in one step according to said compared resultant signals inputted to said microcomputer.

* * * * *